United States Patent [19]

Yamaguchi et al.

[11] Patent Number: 4,933,900
[45] Date of Patent: Jun. 12, 1990

[54] SEMICONDUCTOR MEMORY DEVICE HAVING ARITHMETIC MEANS

[75] Inventors: Yasunori Yamaguchi, Tachikawa; Jun Miyake, Musahino, both of Japan

[73] Assignee: Hitachi, Ltd., Tokyo, Japan

[21] Appl. No.: 281,964

[22] Filed: Nov. 30, 1988

Related U.S. Application Data

[63] Continuation of Ser. No. 874,123, Jun. 13, 1986, abandoned.

[30] Foreign Application Priority Data

Jun. 17, 1985 [JP] Japan .................. 60-129825

[51] Int. Cl.$^5$ .................. G11C 7/00; G11C 11/40
[52] U.S. Cl. .................. 365/189.03; 365/189.08; 365/230.03; 365/195; 365/189.05
[58] Field of Search ........... 365/189, 230, 233, 189.03, 365/189.08, 230.03, 195, 189.05

[56] References Cited

U.S. PATENT DOCUMENTS

| | | | |
|---|---|---|---|
| 4,387,423 | 6/1983 | King et al. | 365/222 X |
| 4,402,043 | 8/1983 | Guttag et al. | 365/94 X |
| 4,496,944 | 1/1985 | Collmeyer et al. | 365/49 X |
| 4,680,701 | 7/1987 | Cochran | 365/233 X |

OTHER PUBLICATIONS

"Nikkei Electronics" of Nikkei, McGraw Hill Corp., Feb. 11, 1985, pp. 219-229.
"Hitachi IC Memory Data Book", Sep. 1983, pp. 314-320.

Primary Examiner—James W. Moffitt
Assistant Examiner—Alyssa H. Bowler
Attorney, Agent, or Firm—Antonelli, Terry, Stout & Kraus

[57] ABSTRACT

A single chip semiconductor memory device having an arithmetic circuit to conduct plural kinds of arithmetic operations and a mask control circuit for inhibiting a substantial change in data in memory irrespective of the operations of the arithmetic circuit when it is brought into a masking state. The semiconductor memory device takes a preset operation mode for receiving from the outside a control signal for the arithmetic circuit and the mask control circuit. This control signal for the arithmetic circuit and the mask control circuit, which is given to the semiconductor memory device when in the preset operation mode, is latched in the semiconductor memory device until the device is brought again into the preset operation mode.

16 Claims, 6 Drawing Sheets

SEMICONDUCTOR MEMORY DEVICE HAVING ARITHMETIC MEANS

This application is a continuation of application Ser. No. 874,123, filed on June 13, 1986 now abandoned.

BACKGROUND OF THE INVENTION

The present invention relates to a semiconductor memory device and, more particularly, to a technique effective when applied to a drawing processing RAM (i.e., Random Access Memory), for example.

A known drawing or picture processing RAM for displaying characters and images on the screen of a display device such as a CRT (i.e., Cathode Ray Tube) is exemplified by a serial access memory which is described in pp. 219 to 239, "Nikkei Electronics" of Nikkei McGRAW-Hill Corporation dated February 11, 1985. This RAM includes an address signal generating counter circuit which is operated by a control signal and a timing signal fed from an external terminal to generate a selection signal for selecting the lines of a memory array. This memory array has its data lines connected in parallel with a data register through a switch circuit so that data is serially transmitted between the data register and the external terminal. Since the data transmission to and from the external terminal is serially conducted, the picture element data synchronized with the raster scanning timing of the CRT can be easily extracted. However, the image processing random access memory thus far described is apparently a RAM but can only act as substantially a shift register having a bit number equal to the storage capacity of the RAM. Accordingly each memory cell is accessed only once each time all the bits are addressed. This raises a problem that the image processing operation followed by a preparation or change of an image is delayed in case a RAM of this kind is used.

For image processing, it is more convenient to use a RAM which can conduct a random accessing operation. We have conceived to construct an image processing RAM (i.e., a so-called "video RAM"). Such a RAM can be accessed as a unit of plural bits such as ×4 bits (see for example the "Hitachi IC Memory Data Book" of Hitachi Ltd., issued in September, 1983). The aforementioned 4-bit signals are used for processing a color drawing or image and have red, blue, green and luminance signals assigned thereto. Even in case the RAM of that construction is used, however, the preparation or change of an image requires memory accessing operations and microprocessor operations over a plurality of cycles, which are effected by reading out picture element data once, by taking logical operations between the picture element data read out and new picture element data or display condition data, and by writing again the obtained picture element data to be changed in the initial memory address.

SUMMARY OF THE INVENTION

An object of the present invention is to provide a semiconductor memory device having multiple functions suitable for processing high-speed image data.

The above-specified and other objects and novel features of the present invention will become apparent from the following description given with reference to the accompanying drawings.

An explanation of the embodiments to be disclosed hereinafter will be briefly described in the following.

A semiconductor memory device comprises an arithmetic circuit enabled to conduct plural kinds of arithmetic operations and a mask control circuit for inhibiting a substantial change in data in a memory irrespective of the operations of said arithmetic circuit when it is brought into a masking state. The semiconductor memory device takes a preset operation mode for receiving from the outside a control signal for the arithmetic circuit and said mask control circuit. This control signal inputted to the semiconductor memory device when in the preset operation mode is latched in the semiconductor memory device until same is brought again into the preset operation mode.

In accordance with a suitable embodiment, the preset operation mode is instructed by a combination of a chip selection signal and a suitable control signal.

DESCRIPTION OF THE PREFERRED EMBODIMENT

Figure 1:
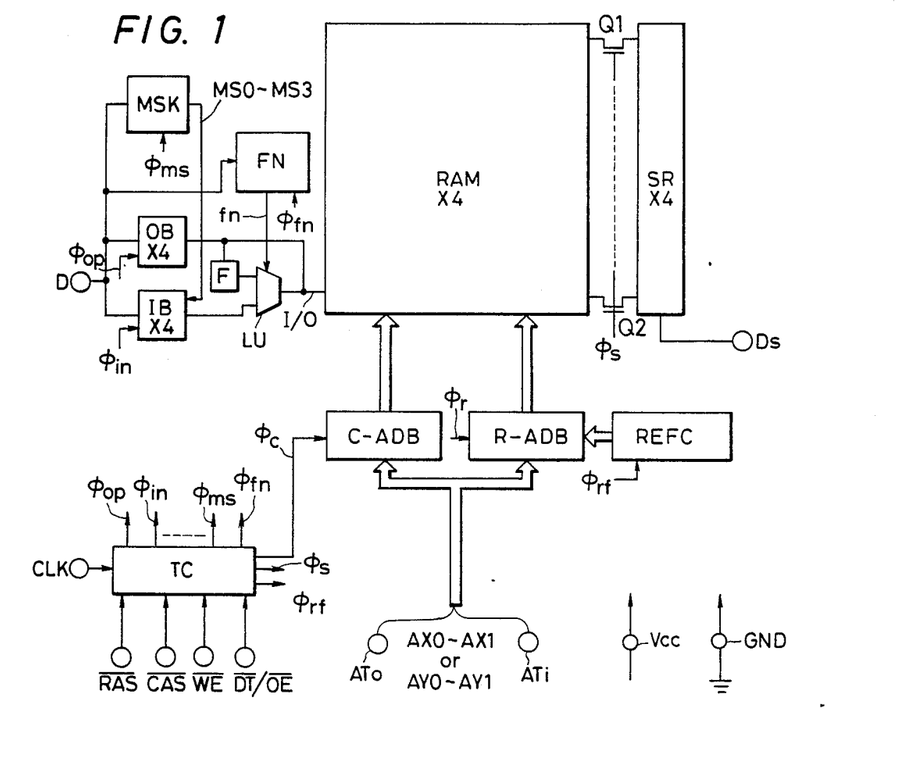
FIG. 1 is a block diagram showing a semiconductor memory according to one embodiment of the present invention.

FIG. 1 is a block diagram showing an embodiment of the present invention. The respective circuit blocks of the figure are formed on one semiconductor substrate such as a single crystal silicon, although not especially limited thereto, by well-known techniques for fabricating a semiconductor integrated circuit.

The semiconductor memory device of this embodiment is equipped with: a group of data input/output terminals D; a group of serial data output terminals Ds; address terminals AT0 to ATi for address signals; a power supply terminal Vcc, a reference potential or earth terminal GND; a terminal $\overline{RAS}$ for a row address strobe signal; a terminal $\overline{CAS}$ for a column address strobe signal; a terminal $\overline{WE}$ for a write enable signal; a terminal $\overline{DT/OE}$ for an extension control signal; and a terminal CLK for a shift controlling clock signal. Although not especially thereto limited, this semiconductor memory device is preferably made having a construction capable of simultaneously accessing a 4-bit data signal. Therefore, each data input/output terminal group D and serial data output terminal group Ds is actually composed of four terminals although it is shown in FIG. 1 as if it were a single terminal.

The semiconductor memory device of present embodiment has an internal circuit for conducting an image processing operation at high speed, as will be described hereinafter, in addition to a dynamic type memory unit RAM having the ×4 construction. Although not especially limited thereto, the memory unit RAM, as shown, is composed of four sets of memory arrays, sense amplifiers and address decoders corresponding one-to-one to the respective bits of the data signal. One set of these memory arrays, sense amplifiers and address decoders is shown by way of example in FIG. 6. The memory array includes a dynamic memory cell which is composed of address selecting MOSFETs (i.e., Metal Oxide Semiconductor Field Effect Transistor) Qm and information storing capacitors Cs' arranged in the form of a matrix. The plurality of address selecting MOSFETs Qm of the above-specified memory cells have their gates coupled to one of corresponding word lines WL and $\overline{WL}$ and their drains coupled to one of corresponding complementary data lines DL and $\overline{DL}$.

Figure 6:
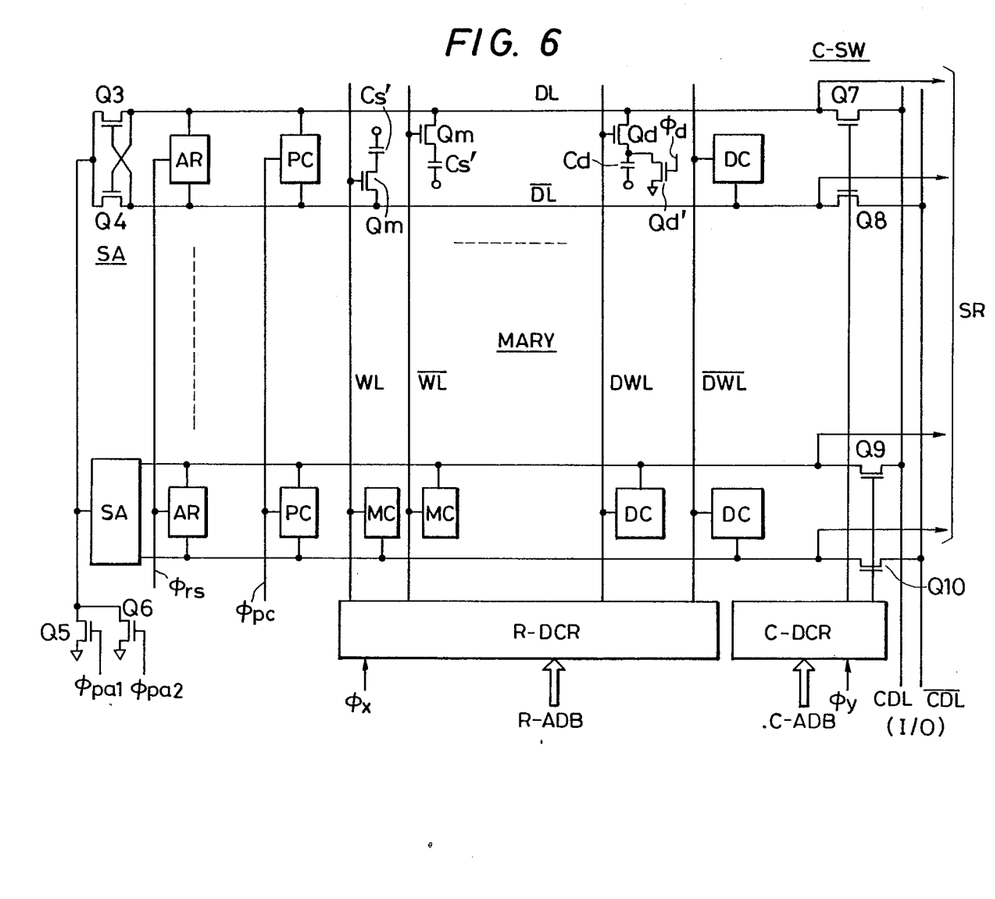
FIG. 6 is a specific circuit diagram showing a memory unit RAM for FIG. 1.

In FIG. 6, a dummy memory cell DC is composed of MOSFETs Qd and Qd' and a capacitor Cd having half of the capacitor of the memory cell capacitor Cs' and is connected either between the data line DL and a dummy word line DWL or between the data line $\overline{DL}$ and a dummy word line $\overline{DWL}$. A sense amplifier SA is composed of a plurality of unit sense circuits corresponding one-to-one to the complementary data lines. Each unit sense circuit is composed, as shown, of MOSFETs Q3 and Q4 having their gates and drains cross coupled. Between each unit sense circuit and the earth terminal of the same, there are connected MOSFETs Q5 and Q6 which act as power switch elements. Precharge circuits PC are coupled between the complementary data lines, respectively, to precharge the respective complementary data lines DL and $\overline{DL}$ before the memory cells DC start to be selected. Active restore circuits AR are operated to sufficiently raise the high level of the complementary data lines DL and $\overline{DL}$ after the memory cells have been selected and after the sense amplifiers SA have been operated.

Between the respective complementary data lines DL and $\overline{DL}$ and common complementary data lines CDL and $\overline{CDL}$, there are connected MOSFETs Q7 to Q10 which construct together a column switch circuit C-SW. This column switch circuit C-SW is switched by a column address decoder C-DCR.

The common complementary data lines CDL and $\overline{CDL}$ construct together the input/output node I/O of the memory unit RAM.

A timing control circuit TC of FIG. 1 generates: timing signals $\phi_{pa1}$, $\phi_{pa2}$, $\phi_{rs}$ and $\phi_{pc}$ for controlling the operations of an active restore circuit AR and the precharge circuit PC; a timing signal $\phi_d$ for resetting the dummy memory cell DC; a word line selection timing signal $\phi_x$ for a row address decoder R-DCR; and a data line selection timing signal $\phi_y$ for the column address decoder C-DCR.

The time sequence of the operations of the memory unit of FIG. 6 is made substantially identical to that of well-known dynamic RAMS. Therefore, an explanation of the respective circuits thereof will be omitted.

The signals of the complementary data lines in the memory array are transferred in parallel to the total of four bits of the shift register SR, respectively, through switch MOSFETs Q1 and Q2 shown by way of example in FIG. 1. These MOSFETs Q1 and Q2 are switched by a timing signal $\phi_s$ which is fed commonly to the gates thereof. Thus, the transfer timing of the data signals is controlled. The function of this memory array to read out the memory information of one word line in parallel and to serially send out the 4-bit signal from each of the total of four shift registers SR to the four external terminals Ds is convenient for generating the red, blue, green and luminance image data comprising the color picture elements to be displayed in synchronism with the raster scanning timing of the CRT.

A row address buffer R-ADB receives external address signals AX0 to AXi in synchronism with a timing signal $\phi_r$ generated on the basis of the row address strobe signal $\overline{RAS}$ to generate an internal complementary address signal to be transmitted to the row address decoder. The R-DCR included in the memory unit RAM decodes those address signals and selects the prescribed word lines and dummy word lines in synchronism with the word line selection timing signal $\phi_x$.

A column address buffer C-ADB receives external address signals AY0 to AYi and transmits them to the column address decoder in synchronism with a timing signal $\phi_c$ which is generated on the basis of the column address strobe signal $\overline{CAS}$ fed in a delayed manner with respect to the row address strobe signal. The column address decoder C-DCR included in the memory unit RAM decodes those address signals and selects the data lines in synchronism with the data line selection timing signal $\phi_y$.

A data input circuit IB is composed of four circuits which are brought into their operative states in response to a timing signal $\phi_{in}$. When the data input circuit IB comes into its operative state in response to the timing signal $\phi_{in}$, it amplifies the 4-bit data signals fed from the external terminals D and takes them into its internal circuits. A specific example of the data input circuit IB will be described hereinafter with reference to FIG. 8. In an ordinary operating state, the aforementioned signals outputted from the data input circuit IB are used as signals to be written in. The operative state of the data input circuit IB responding to the timing signal $\phi_{in}$ is selectively turned inoperative in response to a mask signal MS0-MS3 which is generated by a later-described mask setting circuit MSK. In other words, an arbitrary one of those four circuits is turned inoperative. This masking operation for the external write signals is used as a convenient function in case any of one to three signals of one picture element data composed of the red, blue, green and luminance signals is selectively inputted.

A data output circuit OB is composed of four circuits which have their operations controlled in response to a timing signal $\phi_{op}$ so that they amplify and send out the 4-bit signals of the corresponding input/output nodes I/O of the memory unit RAM to external terminals Do when they are turned operative in response to the timing signal $\phi_{op}$.

The mask setting circuit MSK has its input operation controlled in response to a timing signal $\phi_{ms}$. When the mask setting circuit MSK is brought into its input operative state in response to the timing signal $\phi_{ms}$, it takes in the signals being fed at that time to the external terminal group D and decodes them to generate the mask signals MS0 to MS3 for selective rendering of the data input circuit IB inoperative.

A function setting circuit FN has its input operation so controlled in response to a timing signal $\phi_{fn}$ that it takes in the signals fed through the data input/output terminal group D, when it is brought into its operative state, and decodes them to generate an arithmetic mode signal fn for setting the arithmetic mode of a logical arithmetic circuit LU.

The aforementioned logical arithmetic circuit LU is composed of four circuits corresponding to the aforementioned four memory units in RAM and is made responsive to both a signal coming from a latch circuit F, which is connected with one input thereof, and a write signal fed from the external terminals D through the data input circuit IB to conduct a variety of logical arithmetic operations such as AND, NAND, OR, NOR, inversion or exclusive logical sum in accordance with the arithmetic mode signal fn. The aforementioned latch circuit F has its input terminal coupled to the input/output node I/O (i.e., the common data line of the memory array) of the memory unit RAM to latch the stored information of the memory cell selected. The logical arithmetic circuit LU can be constructed, for example, of a combination of a plurality of logical gate circuits and a multiplexer circuit for switching the signal transmission paths. A preferable example of the logical arithmetic circuit LU will be described hereinafter with reference to FIG. 9.

The timing control circuit TC is made responsive to the address strobe signals $\overline{RAS}$ and $\overline{CAS}$, the write enable signal $\overline{WE}$, an extension operation signal $\overline{DT/OE}$ fed from the outside, and the clock signal CLK for operating a shift register SR to discriminate the operation mode instructed by those external signals, and to form the various timing signals for the aforementioned respective circuits. The timing control circuit TC is constructed of a plurality of logical gate circuits, signal delay circuits and signal latch circuits. However, the specific internal construction of the timing control circuit TC is not shown because it can be relatively easily determined once its relationship with the timing signals to become input control signals is ascertained.

The timing control signal TC is basically constructed to determine the operation modes in the following manner.

Specifically, the timing control circuit TC is deemed to be in a preset operation mode if the write enable signal $\overline{WE}$ is at an enable level such as a low level at the timing in which the row address strobe signal $\overline{RAS}$ is turned to an active level such as the low level from an inactive level such as a high level. Although not especially required, the preset operation mode is continued until the row address strobe signal $\overline{RAS}$ is caused to restore the high level. The mask setting circuit MSK and the function setting circuit FN are basically brought into a data taking state in that preset operation mode. However, the mask setting circuit MSK and the function setting circuit FN have their data take-in timings made different from each other (i.e., not identical) so that their data taking operations may be controlled independently of each other. Whether or not the mask setting circuit MSK and the function setting circuit FN should respectively take new data is instructed by the extension instructing signal $\overline{DT/OE}$. If the signal $\overline{DT/OE}$ is set at the high level at the data taking timing of the mask setting circuit MSK, this circuit does not take in new mask data although not especially limited thereto. If the signal $\overline{DT/OE}$ is at the low level at the data taking timing of the function setting circuit FN, on the contrary, this circuit does not take in new function data.

The timing control circuit TC is to be deemed in its ordinary memory access operation if the write enable signal $\overline{WE}$ is at the high non-enable level at the timing in which the row address strobe signal $\overline{RAS}$ is changed from the high to low level.

Figure 7:
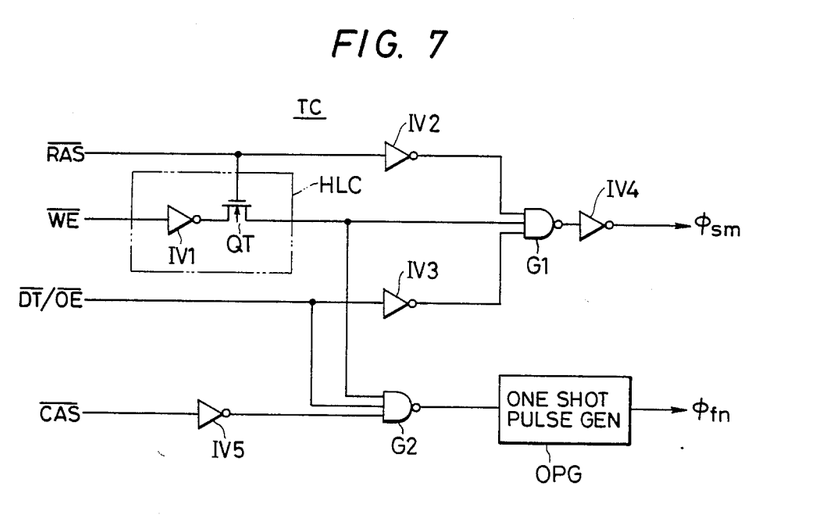
FIG. 7 is a specific circuit diagram showing a timing control circuit for FIG. 1.

FIG. 7 shows such one of the various internal circuits comprising the timing control circuit TC as will generate timing signals $\phi_{sm}$ and $\phi_{fn}$.

An inverter circuit IV1 and a transmission gate MOSFET QT form a signal latch circuit HLC.

In this circuit HLC, the MOSFET QT is turned on in response to the high level of the row address signal $\overline{RAS}$, if so, to transmit the output of the inverter circuit IV1 to gate circuits G1 and G2. If the $\overline{RAS}$ signal is dropped to the low level, the MOSFET QT is accordingly turned off. At this time, the output of the circuit HLC, i.e., the input of the gates G1 and G2 is held at the previous level by its stray capacitance. The latch circuit HLC substantially form a preset operation mode detecting circuit.

If the preset operation mode is instructed, the output of the circuit HLC takes the high level. Therefore, the timing signal $\phi_{sm}$ obtained through the NAND gate circuit G1 and an inverter circuit IV4 is caused to take the high level accordingly as the extension control signal $\overline{DT/OE}$ and the signal $\overline{RAS}$ are dropped to the low level.

The output of the NAND gate circuit G2 is dropped to the low level accordingly as the signal $\overline{CAS}$ is dropped to the low level with the $\overline{DT/OE}$ signal being at the high level. A one-shot pulse generator OPG generates a one-shot pulse signal as the timing signal $\phi_{fn}$ in response to the breakage of the output of the gate circuit G2.

A refresh control circuit REFC includes a not-shown refresh address counter circuit for generating a refreshing address signal, although not especially restricted thereto. The aforementioned timing control circuit TC deems that the refreshing operation mode is instructed, if the column address strobe signal $\overline{CAS}$ is dropped to the low level prior to the row address strobe signal $\overline{RAS}$. At this time, the timing control circuit TC generates a refresh signal $\phi_{rf}$ synchronously as the row address strobe signal $\overline{RAS}$ is dropped to the low level. In response to this refresh signal $\phi_{rf}$, the refresh address counter circuit is advanced step-by-step (to conduct the counting operation). In the refreshing mode, the refreshing address circuit generated by the counter circuit in the aforementioned refresh control circuit REFC is transmitted to the input of the row address buffer R-ADB and is fed through same to the row decoder of the memory unit RAM.

Next, one example of the operations of the semiconductor memory device according to this embodiment will be described in the following with reference to the timing charts shown in FIGS. 2 to 4.

First of all, the data are inputted to the mask setting circuit MSK and the function setting circuit FN in the following manner.

Figure 2:
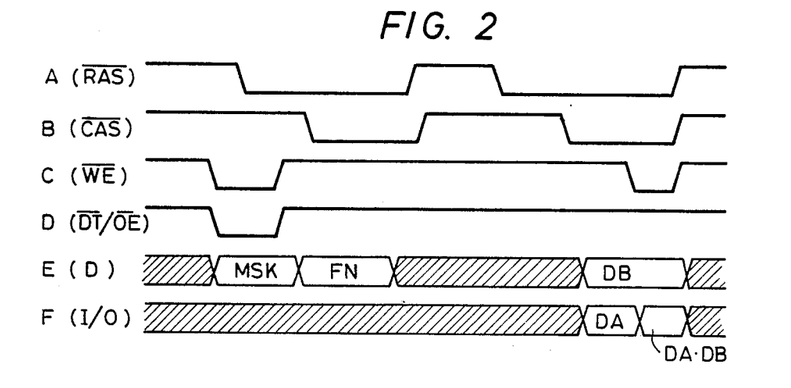
FIGS. 2, 3, 4 and 5 are timing charts showing one example of the operations of the semiconductor memory.
Figure 3:
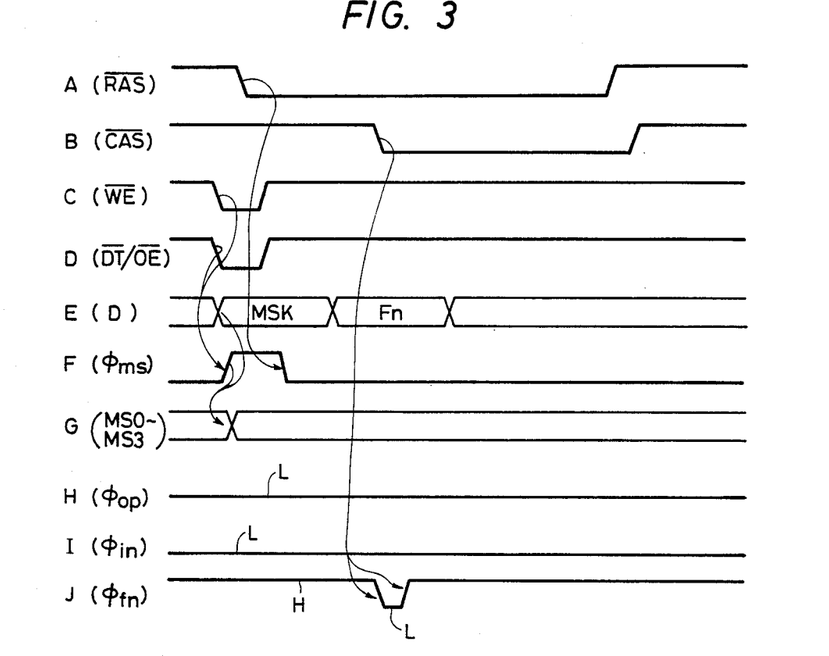

That is to say, before the row address strobe signal RAS is changed from the high to low level, the write enable signal $\overline{WE}$ is dropped to the low level, as indicated at C in FIG. 2 or 3. If the write enable signal $\overline{WE}$ is at the low level in advance, the timing control circuit TC starts its controlling operation for the presetting operation mode. More specifically, the timing control circuit TC judges that the write enable signal $\overline{WE}$ is at the low level at the timing in which the row address strobe signal $\overline{RAS}$ is changed from the high to low level. The timing control circuit TC refers to the extension control signal $\overline{DT/OE}$ at this time, too. If this extension control signal $\overline{DT/OE}$ is at the low level together with the write enable signal $\overline{WE}$, as indicated at D in FIGS. 2 and 3, it is deemed that the inputting operation of the mask setting circuit MSK is instructed. In this case, therefore, a timing signal $\phi_{ms}$ is outputted from the timing control circuit TC in synchronism with the breakage of the row address strobe signal $\overline{RAS}$, as indicated at F in FIG. 3. The mask setting circuit MSK is brought into its inputting state in response to the timing signal $\phi_{ms}$. As a result, the signal fed to the external terminal D is taken as a mask setting signal into the mask setting circuit MSK. If the extension control signal $\overline{DT/OE}$ is at the high level at the timing of the breakage of the row address strobe signal $\overline{RAS}$, the mask setting circuit MSK is left in its non-inputting state. In other words, the timing signal $\phi_{ms}$ is not generated. As a result, the mask setting operation for a new mask data is not conducted at this time.

Then, the timing control circuit TC refers the extension signal $\overline{DT/OE}$ at the timing, in which the column address strobe signal $\overline{CAS}$ is changed from the high to low level, to generate the timing signal $\phi_{fn}$ in synchronism with the breakage of the column address strobe signal $\overline{CAS}$, as indicated at J in FIG. 3, if that signal $\overline{DT/OE}$ is at the high level, as indicated at DA in FIG. 2 and at D in FIG. 3. In response to that timing signal $\phi_{fn}$, the function setting circuit FN is brought into its inputting state. As a result, the signal fed from the aforementioned external terminal D at this time is taken into the function setting circuit FN. Incidentally, if the extension control signal $\overline{DT/OE}$ is still at the low level at the breaking timing of the column address strobe signal $\overline{CAS}$, the function setting circuit FN is left at its inoperative state. In other words, the timing signal $\phi_{fn}$ is not generated. As a result, the function setting operation is not conducted at this time.

In case the presetting mode is instructed as above, the various timing signals for operating the row address buffer R-ADB, the column address buffer C-ADB and the memory unit RAM are not generated, although not especially limited thereto.

When the aforementioned address strobe signals $\overline{RAS}$ and $\overline{CAS}$ and the write enable signal $\overline{WE}$ are raised to the high level, the not-shown internal circuits in the timing control circuit TC are accordingly brought once into the reset state. Even in this reset state, the aforementioned mask setting circuit MSK and function setting circuit FN still latch the aforementioned received signals.

The ordinary memory accessing operations are conducted in the following manner.

In case the ordinary memory accessing operations are instructed, the write enable signal $\overline{WE}$ has been raised to the high level at the breaking timing of the row address strobe signal $\overline{RAS}$, as has been described above. As a result, the timing control circuit TC generates the timing signal $\phi_r$ accordingly as the row address strobe signal $\overline{RAS}$ is changed from the high to low level. The row address buffer R-ADB is rendered operative in response to the timing signal $\phi_r$ to take in the address signals fed from the external address terminals as the row address signals AX (i.e., AX0 to AXi). After this, in response to the change of the row address strobe signal $\overline{RAS}$ to the low level, the aforementioned timing control circuit TC generates the word line selection timing signal $\phi_x$ for operating the row circuits of the memory unit RAM, the sense amplifier operation timing signals $\phi_{pa1}$ and $\phi_{pa2}$, and the active restore operation timing signal $\phi_{rs}$ in a time-series manner.

Next, the timing control circuit TC generates the timing signal $\phi_c$ synchronously as the column address strobe signal $\overline{CAS}$ is changed from the high to low level. Then, the column address buffer C-ADB is rendered operative to take in the address signals fed from the external address terminals as the column address signals AY (i.e., AY0 to AYi). The aforementioned timing circuit TC generates the data line selection timing signal $\phi_y$ of the memory unit RAM, although not shown. As a result, the selecting operations of the data lines are conducted. Specifically, the memory information DA of the memory cell designated by the aforementioned address signals AX and AY is fed to the common data line (i.e., the input/output node I/O). The memory information of the input/output node I/O is taken into the latch circuit F. This latch circuit F has its data taking operations controlled in response to the following timing signals outputted from the timing control circuit TC. Specifically, the timing signal for the latch circuit F is generated for a prescribed period after the column switch C-SW (of FIG. 6) has been operated in response to the data line selection timing signal $\phi_y$. By the control of the latch circuit by that timing signal, it is possible to prevent the undesirable change of the data latched by the latch circuit F when a signal is outputted from the later-described logical arithmetic circuit LU.

As a result of these operations, how the information DA fed to the input/output node is to be processed is substantially determined in the following manner by the write enable signal $\overline{WE}$.

In case the write operation mode is instructed as a result that the write enable signal $\overline{WE}$ is dropped to the low level, the timing signal $\phi_{in}$ for rendering the data input circuit IB operative is generated so that the write signal DB fed from the external terminal D is taken into the data input circuit IB.

Figure 4:
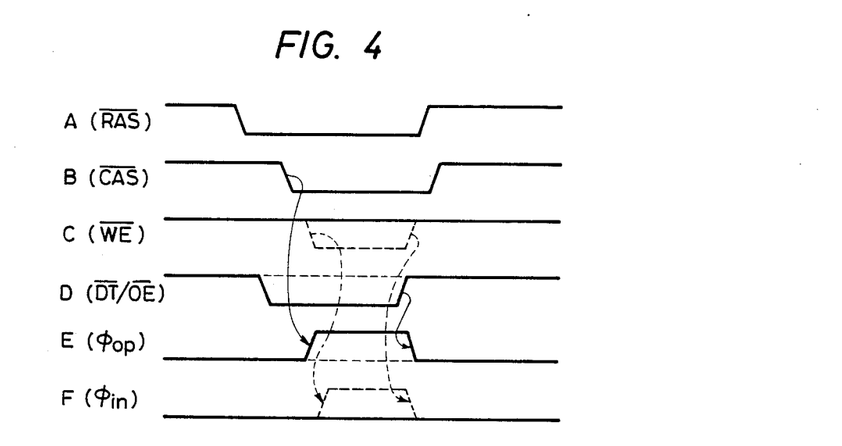

FIG. 4 indicates at F the timing chart of the timing signal $\phi_{in}$. This timing signal $\phi_{in}$ is raised to the high level, as indicated by broken line at F in FIG. 4, responsively as the write enable signal $\overline{WE}$ is dropped to the low level, as indicated by broken line at C in FIG. 4, after the column address strobe signal $\overline{CAS}$ (as indicated at B in FIG. 4) has been dropped to the low level. In response to the high level of the write enable signal $\overline{WE}$, the timing signal $\phi_{in}$ is raised to the high level.

The write signal DB taken into the data input circuit IB and the signal DA taken into the latch circuit F are fed to the logical arithmetic circuit LU.

If the function setting circuit FN is caused to instruct the logical arithmetic circuit LU of the AND operation, for example, by the aforementioned function setting, the logical arithmetic circuit LU generates the AND signal DA.DB of the signal DA of the latch circuit F and the write signal DB and transmits it to the aforementioned I/O. As a result, the AND signal DA.DB is written in the memory cell selected. As a result, by the writting operation of one cycle, the memory information of the memory cell can be replaced by the picture element data according to the logical operation of that memory information and the write signal fed from the external terminal. Incidentally, although omitted from FIG. 1, if one to three of the four logical arithmetic circuits LU are rendered inoperative in response to the output signal of the aforementioned mask settig circuit MSK, the memory array of the memory units RAM corresponding to the logical arithmetic circuits LU rendered inoperative maintains the original memory information. As a result, the aforementioned logical arithmetic result can be written by one to three bits for the memory units RAM.

In case only a prescribed bit of the 4-bit write signals fed from the external terminals D is written in the memory units RAM, the mask signals MS0 to MS3 are set. These mask signals MS0 to MS3 render their corresponding data input circuit IB inoperative. As a result, the write signals fed to the external terminals D are made ineffective. Specifically, this mask function is utilized in case the signal fed from the external terminal is to be written for only prescribed ones of the totally four memory cells to be simultaneously selected by the addressing of the memory units RAM.

Although not especially thereto, the mask and function settings are conducted, as has been described hereinbefore. If the operations in a new presetting mode are carried out, the preceding state is released and replaced by a newly set mask or function. Thus, it is possible to reduce the number of operational cycles for setting the masks and functions. Usually in the drawing processing, either the picture elements composing one drawing or the picture image forming a prescribed area is composed of a multiplicity of dots (or bits). In case imaging data are to be changed, therefore, an identical logical operation is repeated for the multiple dots. It follows that the method of replacing the release of the function setting by a new setting makes the use of the memory convenient.

The reading operations are made similar to those of the dynamic RAM of ×4 construction of the prior art. Incidentally, in this case, the function may mask a prescribed one of the four bits of the picture element signal, but this operation is not important because it can be realized by processing that bit at the side of the microprocessor.

The timing signal $\phi_{op}$ to be fed to the data output circuit OB in the data reading operation is so changed as is indicated at E in FIG. 4.

Specifically, the timing signal $\phi_{op}$ is raised to the high level, as indicated by solid line at E in FIG. 4, responsively as the column address strobe signal $\overline{CAS}$ is dropped to the low level, as indicated at B in FIG. 4. More specifically, the timing signal $\phi_{op}$ is raised to the high level after the data line timing signal $\phi_y$ relating to the column address strobe signal $\overline{CAS}$ has been outputted, namely, after the information of the memory unit RAM has been fed to the input/output node I/O.

According to this embodiment, whether or not the timing signal $\phi_{op}$ is to be outputted is controlled by the extension control signal $\overline{DT/OE}$, although not especially limited thereto. If the extension control signal $\overline{DT/OE}$ is set at the low level, as indicated by solid curve at D in FIG. 4, for a time period between the breakage of the row address strobe signal $\overline{RAS}$ and the breakage of the column address strobe signal $\overline{CAS}$, the timing signal $\phi_{op}$ is raised to the high level, as indicated by solid curve at E in FIG. 4. If the extension control signal $\overline{DT/OE}$ is maintained at the high level, as indicated by broken line, on the contrary, the timing signal $\phi_{op}$ is not outputted.

The timing signal $\phi_{op}$ once raised to the high level is dropped to the low level in response to the high level of the extension control signal $\overline{DT/OE}$, although not especially limited thereto.

When in the reading operation, the timing signal $\phi_{in}$ for the data input circuit IB is not outputted, as indicated by solid line at F in FIG. 4. In response to this, the data input circuit IB is rendered inoperative. In response to this, on the other hand, the data of the input/output node I/O is not changed.

In case the output of the timing signal $\phi_{op}$ is controlled by the extension control signal $\overline{DT/OE}$ as above, it is possible to realize a desired circuit operation. In case the control signal such as the extension control signal $\overline{DT/OE}$ is not utilized, more specifically, there arises a fear that the timing signal $\phi_{op}$ is erroneously outputted even in the writing operation because the timing signal $\phi_{in}$, for example, is outputted. By making use of the extension control signal $\overline{DT/OE}$, the erroneous output of the timing signal $\phi_{op}$ is prevented when in the writing operation.

The extension control signal $\overline{DT/OE}$ is used on one hand as the control signal for extending the input of the operation control data such as the aforementioned mask data and function data and on the other hand as the output control signal for an ordinary memory access.

The extension control signal $\overline{DT/OE}$ is further used as the control signal for presetting the data to the shift register SR.

Figure 5:
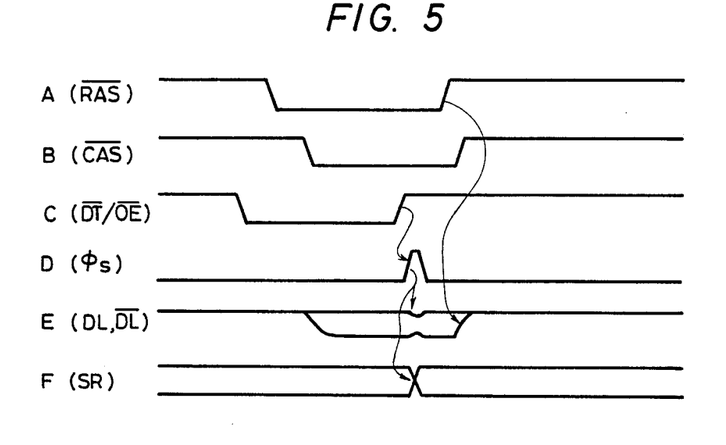

FIG. 5 shows at D the timing chart of the timing signal $\phi_s$ to be fed to the MOSFETs Q1 and Q2 of FIG. 1.

The timing signal $\phi_s$ is raised to the high level for a prescribed period, as indicated at D in FIG. 5, responsively as the extension control signal $\overline{DT/OE}$ is changed from the low to high level, as indicated at C in FIG. 5. In response to this, the read data of the respective complementary data lines DL and $\overline{DL}$ of the memory unit RAM are fed to the shift register SR. As a result, the data of the shift register SR is renewed, as indicated at F in FIG. 5. Incidentally, although not essentially, by a temporary redistribution of the charges generated between the complementary data lines DL and $\overline{DL}$ and the input node of the shift register SR when the MOSFETs Q1 and Q2 and so on are turned on, the level of the read data fed to the complementary data lines DL and $\overline{DL}$ is temporarily changed, as indicated at E in FIG. 5.

The serial reading operations can be conducted generally similarly to the aforementioned well-known serial memory. Specifically, in response to the clock signal CLK fed from the outside, the shift clock signal is outputted from the timing control circuit TC. The shift register SR is operated by that shift clock signal. Since, in this embodiment, the row address can be arbitrarily set by the address signal fed from the external terminals, the function to scroll the display screen can be realized. Specifically, the picture on the display screen can be moved upward or downward by changing the row address which is set in synchronism with the first raster of the CRT.

Figure 8:
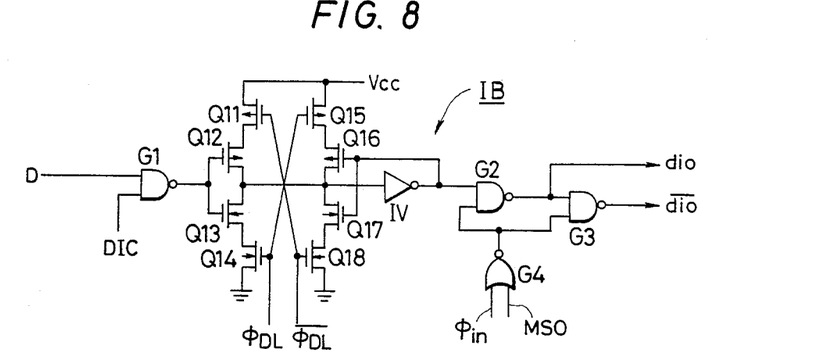
FIG. 8 is a specific circuit diagram showing a data input circuit IB.

FIG. 8 shows a specific circuit example of the data input circuit IB.

The data input circuit IB is constructed, as shown, of: a data holding circuit or a latch circuit composed of the input gate circuit G1, MOSFETs Q11 to Q18, and an inverter circuit IV; and an output circuit composed of gate circuits G2 to G4.

The input gate circuit G1 is constructed of a 2-input NAND circuit having its one input terminal coupled to one of the grouped terminals D of FIG. 1 and its other input terminal coupled to the timing control circuit TC of FIG. 1. The input gate circuit G1 forms not only an input gate but also a waveform shaping circuit or a level judging circuit for an input signal at a TTL level to be fed to the terminal group D.

The latch circuit has its operations controlled by complementary timing signals $\phi_{DL}$ and $\overline{\phi_{DL}}$ fed from the timing control circuit TC.

The output circuit has its operations controlled by both the timing signal $\phi_{in}$ fed from the timing control circuit TC and one MS0 of the 4-bit mask signals MS0 to MS3 fed from the mask setting circuit MSK. Each mask signal is deemed as the mask level if it is at the high level and as the non-mask level if it is at the low level.

Figure 10:
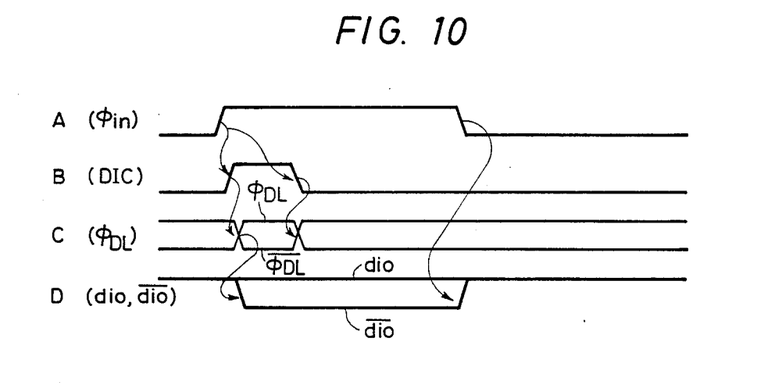
FIGS. 10 and 11 are timing charts for explaining the operations of the data input circuit IB.

The timing signal fed to the data input circuit IB are shown in FIG. 10.

The timing signal $\phi_{in}$ is shown at F in FIG. 4 and is changed, as indicated at A in FIG. 10.

A timing signal DIC is held at the high level, as indicated at B in FIG. 10, for a prescribed period after the timing signal $\phi_{in}$ has been raised to the high level.

The timing signals $\phi_{DL}$ and $\overline{\phi_{DL}}$ are set at the high and low levels, respectively, as indicated at C in FIG. 10, in response to the timing signal DIC.

The latch circuit composed of the MOSFETs Q11 to Q18 and the inverter circuit IV takes in the data signal which is fed through the gate circuit G1 responsively as the timing signals $\phi_{DL}$ and $\overline{\phi_{DL}}$ are set at the high and low levels, respectively. This latch circuit latches the data signal at the preceding level irrespective of the output of the gate circuit G1 if the timing signals $\phi_{DL}$ and $\overline{\phi_{DL}}$ are set at the low and high levels, respectively.

Figure 11:
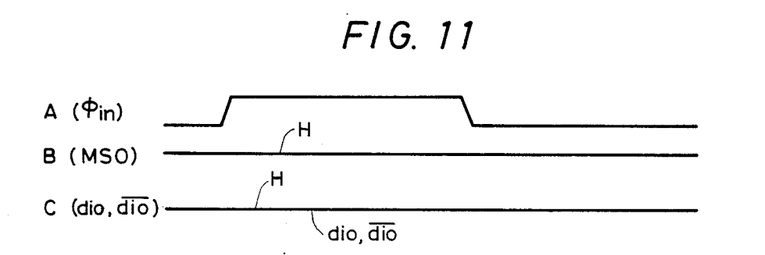

The output circuit composed of the gate circuits G2 to G4 is set at the effective level, as indicated at D in FIG. 10, for substantially the same period as the high-level period of the timing signal $\phi_{in}$ if the mask signal MS0 is set at the non-mask level, i.e., the low level. Specifically, one of complementary output signals $d_{io}$ and $\overline{d_{io}}$ is raised to the high level whereas the other is dropped to the low level. If the mask signal MS0 is set at the mask level, i.e., at the high level, as indicated at B in FIG. 11, the complementary output signals $d_{io}$ and $\overline{d_{io}}$ are brought into an ineffective level, i.e., the high level irrespective of the timing signal $\phi_{in}$, as indicated at C in FIG. 11.

Figure 9:
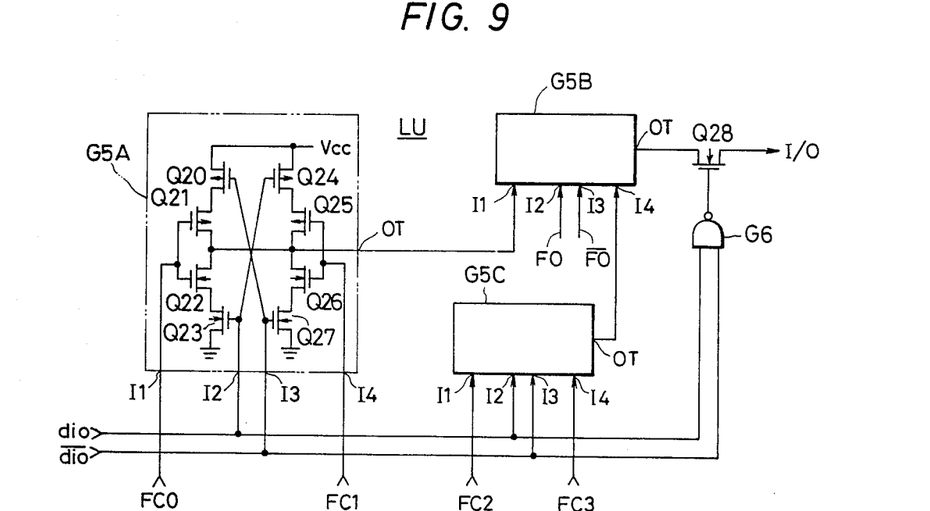
FIG. 9 is a specific circuit diagram showing a logical arithmetic circuit LU.

FIG. 9 shows a specific circuit example of the logical arithmetic circuit LU.

This logical arithmetic circuit LU is composed of logical circuits G5A to G5C and a transmission gate MOSFET Q28.

The logical circuits G5A to G5C are made to have a common construction. For simplicity of presentation of the drawing, therefore, only the logical circuit G5A is specifically shown. As shown, the logical circuits G5A to G5C have their corresponding input and output terminals denoted at identical reference characters.

The first input terminals I2 and I3 of the logical circuits G5A and G5C are fed with the output signals $d_{io}$ and $\overline{d_{io}}$, whereas the first input terminals I2 and I3 of the logical circuit G5B are fed with the complementary output signals F0 and $\overline{F0}$ of the latch circuit F of FIG. 1.

The second and third input terminals I1 and I4 of the logical circuits G5A and G5C are fed with the output signals FC0 to FC3 of the function setting circuit FN, whereas the second and third input terminals I1 and I4 of the logical circuit G5B are fed with the output signals of the logical circuits G5A and G5C.

The number of combinations of the function instructing signals FC0 to FC3 are 16 so that the logical circuits G5A to G5C accordingly conduct one arithmetic operation instructed by the function instructing signals FC0 to FC3.

The transmission gate MOSFET Q28 is turned on responsively as at least one of the input data signals $d_{io}$ and $\overline{d_{io}}$ is dropped to the low level.

If the outputs $d_{io}$ and $\overline{d_{io}}$ of the data input circuit IB are not masked by the mask signal MS0, therefore, the logical arithmetic circuit LU feeds the arithmetic result to the input/output node I/O of the memory unit RAM at the timing in which the signals $d_{io}$ and $\overline{d_{io}}$ are set the complementary levels.

If the mask signal MS0 is set at the mask level, both the signals $d_{io}$ and $\overline{d_{io}}$ are held at the high level. In response to this, the MOSFET Q28 is held at its OFF state. In this case, it goes without saying that the level of the input/output node I/O is not changed by the logical arithmetic circuit LU.

In accordance with the present invention, the following effects can be attained:

(1) Since the signals from the external terminals can be taken in as the mask signals and the function signals under the operations similar to the memory accessing operations by combining the feed timings of the row address strobe signals the levels of other control signals, there can be attained an effect that the mask and the functions can be easily set.

(2) By providing the arithmetic circuits in the RAM, the stored information of the memory cell selected by addressing the arithmetic circuits in one writing cycle can be replaced by the arithmetic result between that stored information and the write signals fed from the external terminals. This provides an effect that the image processing for preparing or changing an image can be conducted at a high speed.

(3) For a prescribed arbitrary bit of the signals of plural bits, the address decoder is rendered inoperative by interrupting generations of the word line selection timing signal, the sense amplifier operation timing signal and the data line selection timing signal. The arithmetic circuits may conduct not only the logical operation but also the arithmetic operation. The row (X) and column (Y) address signals may be fed from such external terminals as are independent of each other. Since, in this case, the access of the RAM is started in response to the chip selecting signal, the aforementioned mask and function signals are taken in by the combination of the write enable signal and other control signals through the aforementioned data input buffer or through the address terminals and the address buffer made receptive of those signals. The refreshing operations may be conducted in response to the refresh control signals fed from the external terminals. Since, in this case, the refreshing period can be set from the external terminals, the parallel transfer to the shift register for the aforementioned serial reading operation can be conducted in parallel with the refreshing operations. Since, moreover, the arithmetic operations of the write signals from the external terminals can be conducted by selectively masking the functions without any consideration of the stored information of the memory cell undesired to be changed, there can be attained an effect that the image can be easily prepared or changed.

(4) Thanks to the foregoing effects (2) and (3), there can be attained another effect that the processing load to be borne by the microprocessor or by an image processor can be lightened while facilitating execution of the programs.

Although our invention has been specifically described in connection with the discussed embodiment, it should not be limited thereto but can naturally be modified in various manners without departing from the gist thereof. For example, the mask setting signal and the function setting signal may be fed from the address terminals. In this case, as in the ordinary memory cycle, the mask signal may be taken in through the row address buffer, and the function signal may be taken in through the column address buffer. In this operation mode, however, the release of the function setting may be automatically effected at the end of the writing cycle after the setting operation. The memory array may be composed of static memory cells.

In case the number of the data input/output terminals or the address terminals to be used for those mask and function setting signals is large, these signals may be fed from the outside not in the time-sharing manner, as in the present embodiment, but in a simultaneous manner.

The present invention can find wide application in a semiconductor memory device which has a drawing processing function or a data processing function.

What is claimed is:

1. A semiconductor memory device formed on one chip comprising:
   a memory unit;
   an arithmetic circuit for generating an arithmetic signal to be fed to said memory unit, wherein said arithmetic circuit has a plurality of operation modes which are designated in accordance with a function signal;
   an input terminal;
   a first circuit for forming said function signal to designate one of said operation modes of said arithmetic circuit on the basis of a first input signal provided from said input terminal;
   a second circuit for forming a mask signal to inhibit a data signal of said memory unit from being changed by an external input data signal provided from said input terminal on the basis of a second input signal provided from said input terminal;
   a timing control signal to which is responsive to control signals applied thereto for generating control timing signals to cause said first and second circuits to receive said first and second input signals, respectively; and
   a data input circuit disposed between one input side of said arithmetic circuit and said input terminal for receiving said input data signal from said input terminal, and having its operations controlled by the mask signal fed from said second circuit,
   wherein said input terminal serves as a common input terminal for said first input signal, said second input signal and said input data signal.

2. A semiconductor memory device formed on one chip according to claim 1, wherein said control signals include a row address strobe signal, a column address strobe signal, and a write enable signal, and
   wherein said timing control signal circuit generates said control timing signals for said first and second circuits in response to the combination of an inactive level of said row address strobe signal and a write enable level of said write enable signal.

3. A semiconductor memory device formed on one chip according to claim 2, wherein said memory unit includes dynamic random access memories.

4. A semiconductor memory device formed on one chip according to claim 3, further comprising:
   a signal latch circuit disposed at one input side of said arithmetic circuit for latching a data signal fed from said memory unit; and
   a data input circuit disposed at another input side of said arithmetic circuit and having its operations controlled by the mask signal fed from said second circuit.

5. A semiconductor memory device formed on one chip according to claim 2, wherein said control signals further include an additional control signal, so that the control timing signal for said first circuit and the control timing signal for said second circuit have their respective outputs controlled by said additional control signal.

6. A semiconductor memory device formed on one chip according to claim 1, wherein said control signals include a row address strobe signal, a column address strobe signal, a write enable signal, and an additional control signal, and
   wherein said timing control signal circuit generates a control timing signal in said timing signals for said second circuit in response to a combination of conditions in which said write enable signal has a first level, said additional control signal has said first level, and a level of said row address strobe signal is changed from a second level to said first level.

7. A semiconductor memory device formed on one chip according to claim 6, wherein said timing control signal circuit generates a control timing signal in said timing signals for said first circuit in response to a combination of conditions in which said additional control signal has said second level and a level of said column address strobe signal is changed from said second level to said first level.

8. A semiconductor memory device formed on one chip according to claim 4, wherein said input terminal is coupled to an input node of said data input circuit, and said first and second circuits are coupled to said input terminal.

9. A single chip semiconductor memory device for processing high-speed image data comprising:
   a memory unit on one semiconductor substrate;
   arithmetic means on said substrate for generating arithmetic signals to be fed to said memory unit wherein said arithmetic means has a plurality of operation modes which are designated in accordance with function signals;
   input terminals;
   first circuit means on said substrate for forming said function signals to designate one of said operation modes in said arithmetic circuit means on the basis of first input signals provided from said input terminals;
   second circuit means on said substrate for forming mask signals to inhibit data signals of said memory unit from being changed by external input data signals provided from said input terminals on the basis of second input signals provided from said input terminals;
   timing control circuit means on said substrate responsive to control signals for generating control timing signals to cause said respective first and second circuit means to receive said first and second input signals; and
   a data input circuit disposed between one input side of said arithmetic circuit and said input terminals for receiving input data signals from said input terminals, and having its operations controlled by the mask signal fed from said second circuit, wherein each of said input terminals serves as a common input terminal for one of said first input signals, one of said second input signals and one of said input data signals.

10. A single chip semiconductor memory device for processing high-speed image data according to claim 9, wherein said control signals include a row address strobe signal, a column address strobe signal, a write enable signal, and an additional control signal, and wherein said timing control circuit means generates a control timing signal in said timing signals for said second circuit means in response to a combination of conditions in which said write enable signal has a first level, said additional control signal has said first level, and a level of said row address strobe signal is changed from a second level to said first level.

11. A single chip semiconductor memory device for processing high-speed image data according to claim 10, wherein said timing control circuit means generates a control timing signal in said timing signals for said first circuit means in response to a combination of conditions in which said additional control signal has a second level and a level of said column address strobe signal is changed from said second level to said first level.

12. A single chip semiconductor memory device for processing high-speed image data according to claim 9, wherein said control signals include a row address strobe signal, a column address strobe signal, and a write enable signal, and said timing control circuit means generates said control timing signals for said first and second circuit means in response to the combination of an inactive level of said row address strobe signal and a write enable level of said write enable signal.

13. A single chip semiconductor memory device for processing high-speed image data according to claim 12, wherein said control signals further include an additional control signal, wherein the control timing signal for said first circuit means and the control timing signal for said second circuit means have their respective outputs controlled by said additional control signal.

14. A single chip semiconductor memory device for processing high-speed image data according to claim 12, wherein said memory unit includes dynamic random access memories.

15. A single chip semiconductor memory device for processing high-speed image data according to claim 11, further comprising:

signal latch circuit means disposed at one input side of said arithmetic means for latching data signals fed from said memory unit; and data input circuit means disposed at another input side of said arithmetic means and having its operations controlled by the mask signals fed from said second circuits.

16. A single chip semiconductor memory device for processing high-speed image data according to claim 15, wherein said said input terminals are coupled to input nodes of data input circuit means, and said first and second circuit means are coupled to said input terminals.

* * * * *